United States Patent [19]

Zachai et al.

[11] Patent Number: 5,843,224

[45] Date of Patent: Dec. 1, 1998

[54] COMPOSITE STRUCTURE COMPRISING A SEMICONDUCTOR LAYER ARRANGED ON A DIAMOND OR DIAMOND-LIKE LAYER AND PROCESS FOR ITS PRODUCTION

[75] Inventors: Reinhard Zachai, Guenzburg; Tim Gutheit; Kenneth Goodson, both of Ulm, all of Germany

[73] Assignee: Daimler-Benz Aktiengesellschaft, Germany

[21] Appl. No.: 512,080

[22] Filed: Aug. 7, 1995

[30] Foreign Application Priority Data

Aug. 5, 1994 [DE] Germany .......................... 44 27 715.6

[51] Int. Cl.⁶ .................................................. C30B 29/04
[52] U.S. Cl. .............................. 117/94; 117/95; 117/96; 117/104; 117/929; 423/446; 427/557
[58] Field of Search .............................. 117/929, 94, 95, 117/96, 104; 423/446; 427/557

[56] References Cited

U.S. PATENT DOCUMENTS

| 4,863,529 | 9/1989 | Imai et al. . | |
|---|---|---|---|
| 4,975,328 | 12/1990 | Hirose et al. . | |
| 5,082,359 | 1/1992 | Kirkpatrick . | |
| 5,082,522 | 1/1992 | Purdes et al. ........................... | 117/929 |
| 5,114,696 | 5/1992 | Purdes . | |
| 5,117,267 | 5/1992 | Kimoto et al. . | |
| 5,186,785 | 2/1993 | Annamalai . | |
| 5,211,995 | 5/1993 | Kuehnle et al. . | |
| 5,223,765 | 6/1993 | Staron et al. . | |
| 5,252,840 | 10/1993 | Shiomi et al. . | |
| 5,306,928 | 4/1994 | Kimoto et al. . | |
| 5,531,184 | 7/1996 | Muranaka et al. ....................... | 117/929 |
| 5,562,769 | 10/1996 | Dreifus et al. ............................ | 117/95 |

FOREIGN PATENT DOCUMENTS

| 421397 | 4/1991 | European Pat. Off. . |
|---|---|---|
| 457508 | 11/1991 | European Pat. Off. . |
| 646950 | 4/1995 | European Pat. Off. . |
| 3832111 | 4/1989 | Germany . |
| 4233085 | 4/1994 | Germany . |
| 2-30697 | 2/1990 | Japan ..................................... 117/929 |
| 2-95900 | 4/1990 | Japan ..................................... 117/929 |
| 3-115194 | 5/1991 | Japan ..................................... 117/929 |
| 4-124090 | 4/1992 | Japan ..................................... 117/929 |
| 2215514 | 9/1989 | United Kingdom . |
| WO 90/06591 | 6/1990 | WIPO . |
| WO 90/10950 | 9/1990 | WIPO . |
| WO 9408076 | 4/1994 | WIPO . |

OTHER PUBLICATIONS

Käufer, Helmut, *Arbeiten mit Kunststoffen,* Zweite, neubearbeitete und erweiterte Auflage, vol. 1, Aufbau und Eigenschaften, Springer–Verlag, (Berlin, Heidelberg and New York), 1978, p. 145.

Weigelt, Werner, "Auf die Anwendung zugeschnittene Eigenschaften", *Plastverabeiter,* vol. 37, No. 2, 1986, pp. 112–114.

Hirose et al., Abstract of Japanese Patent No. 62–278,196.

*Primary Examiner*—Robert Kunemund
*Attorney, Agent, or Firm*—Evenson, McKeown, Edwards & Lenahan P.L.L.C.

[57] ABSTRACT

The invention relates to a composite structure including a semiconductor layer arranged on a diamond layer and/or a diamond-like layer, for subsequent processing to produce electronic components and/or groups of components and to a process for producing such a composite structure. In order to improve the quality of the subsequent components, the diamond layer is deposited underneath the component source zones from which the components are subsequently produced, and the diamond or diamond-like layer is provided at the margins of the component source zones and/or outside of the component source zones with edges where the thickness of the layer changes abruptly such that the edges have an edge height amounting to at least 10%, preferably at least 50%, of the layer thickness of the diamond layer. Imperfections such as dislocations or other discontinuities in the semiconductor layer tend to collect at these edges outside of the component source zones, thereby decreasing the density of discontinuities in the component source zones and improving the quality of electronic components produced of material from the component source zones.

46 Claims, 3 Drawing Sheets

5,843,224

COMPOSITE STRUCTURE COMPRISING A SEMICONDUCTOR LAYER ARRANGED ON A DIAMOND OR DIAMOND-LIKE LAYER AND PROCESS FOR ITS PRODUCTION

BACKGROUND OF THE INVENTION

This invention relates to a composite structure comprising a semiconductor layer arranged on a layer of diamond or diamond-like material for subsequent processing into electronic components, and to a process for producing such a composite structure in which a crystalline growth substrate is provided with a layer of diamond or diamond-like material to form an intermediate substrate which in turn is contacted with a precursor gas for a semiconductor, and a semiconductor layer is deposited from the precursor gas onto the layer of diamond or diamond-like material.

Annamalai, U.S. Pat. No. 5,186,785 discloses a composite structure in which a diamond layer is deposited over nearly the entire surface of a growth substrate of silicon. In the deposition of the diamond layer, the margin of the growth substrate of silicon remains uncoated. On top of the diamond layer, a silicon layer is deposited which projects outwardly beyond the diamond layer, so that it is also peripherally deposited directly on the previously uncoated margin of the silicon growth substrate. After deposition of the Si-layer, its crystal lattice is improved by recrystallization by means of a known zone melting process, whereby the crystal information (lattice spacing and the like) for the Si-layer passes peripherally from the growth substrate into the Si-layer. The composite structure produced in this way is intended for subsequent processing to manufacture electronic components and/or component groups (hereinafter referred to simply as components) on and/or in the diamond layer. After their production, the components are partially removed from the composite structure which carries the applied components depending upon the degree to which they belonged together, in particular by being cut or sawed out. As a result of the fact that the crystal information for forming the semiconductor layer flows exclusively over the margin of the growth substrate, there are a high number of discontinuities, such as displacements or the like, in the crystal lattice of the Si-layer on top of the diamond layer. This has an adverse effect on the quality of the electronic components subsequently produced from the composite structure.

SUMMARY OF THE INVENTION

It is the object of the invention to provide an improved composite structure such that components produced therefrom exhibit higher quality.

This and other objects of the invention are achieved by providing a composite structure comprising a semiconductor layer arranged on a layer of diamond or diamond-like material, the composite structure defining at least one component source zone for subsequent processing into at least one electronic component, the layer of diamond or diamond-like material being formed with at least one edge at which the layer changes abruptly in thickness by at least 10%, and each of these edges at least partially surrounding a component source zone.

In accordance with a further aspect of the invention, the objects are also achieved by providing a process for producing a composite structure comprising a semiconductor layer arranged on a layer of diamond or diamond-like material, the process comprising depositing a layer of diamond or diamond-like material on a crystalline growth substrate to form an intermediate substrate, the layer of diamond or diamond-like material defining at least one component source zone on the intermediate substrate for subsequent processing into at least one electronic component; contacting the intermediate substrate in an evacuatable reactor with a gas comprising a semiconductor precursor and depositing a semiconductor layer from the precursor gas onto the layer of diamond or diamond-like material at least in the component source zone(s) on the intermediate substrate; the layer of diamond or diamond-like material being provided outside of the at least one component source zone with at least one edge at which it changes abruptly in thickness by at least 10%.

Chemical vapor deposition of semiconductor layers, including various types of layers of diamond or diamond-like material, such as diamond-like carbon, is known in the art. Representative examples are disclosed in Imai et al., U.S. Pat. No. 4,863,529; Kirkpatrick, U.S. Pat. No. 5,082,359; Purdes, U.S. Pat. No. 5,114,696; Kimoto et al., U.S. Pat. No. 5,117,267; Annamalai, U.S. Pat. No. 5,186,785; Staron et al., U.S. Pat. No. 5,223,765; Shiomi et al., U.S. Pat. No. 5,252,840; Kimoto et al. U.S. Pat. No. 5,306,928; and Klages et al., WO 94/08,076, the disclosures of which are incorporated herein by reference.

By means of the intentional formation of edges in the diamond layer in the region under and outside of the subsequently to be formed components and/or groups of components (referred to hereinafter as component source zones) for example in the form of edges of elevations or depressions arranged selectively on the growth substrate, discontinuities (such as displacements or the like) which grow during the deposition of the semiconductor layer and/or which grow out of the growth substrate, collect at the edges. As a result, between these edges (i.e. in the vicinity of the component source zones), the semiconductor layer (which is deposited following the diamond layer) exhibits a lower density of discontinuities. The semiconductor layer preferably is formed from a Si-layer. The electronic components can then be produced or arranged in the area of the Si-layer which exhibits a lower number of discontinuities, i.e. in the vicinity of the component source zones, and subsequently the individual components or component groups can be cut out from the component source zones of the substrate.

BRIEF DESCRIPTION OF THE DRAWING

The invention will be described in further detail with reference to illustrative preferred embodiments depicted in the accompanying drawings in which.

DETAILED DESCRIPTION OF PREFERRED EMBODIMENTS

Figure 1:
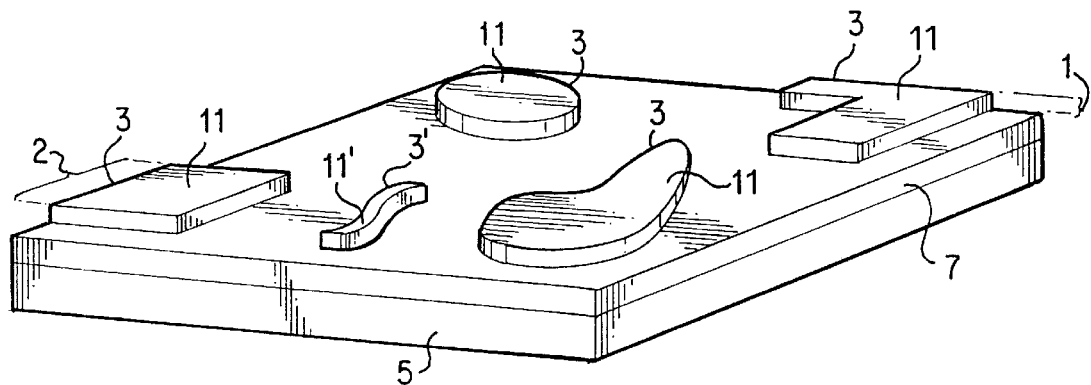
FIG. 1 shows a growth substrate with a diamond layer formed of individual diamond islands deposited thereon.

FIG. 1 shows a growth substrate 5 with a diamond layer produced in the form of individual diamond islands 11 deposited thereon as described hereinafter. With the growth substrate 5 according to FIG. 1, a composite structure can be produced which is intended for advantageous subsequent application of electronic components and/or component groups, in the following referred to simply as components, and which has a semiconductor layer 5 arranged at least on the diamond islands 11 (see FIGS. 4 and 5).

The diamond layer 1, which is expediently polycrystalline and/or monocrystalline in form, can be utilized as an electronically passive and/or as an electronically active material, whereby among other things in all cases the high thermal conductivity and with pure diamonds additionally the good electrical insulation of this diamond layer are advantageous.

Figure 4:
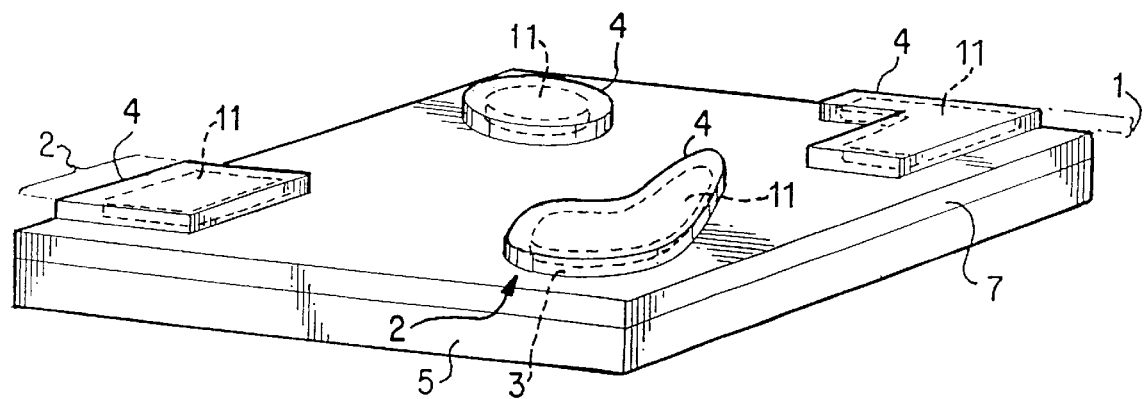
FIG. 4 shows a composite substrate with a semiconductor layer deposited thereon so as to project beyond the margins of the diamond islands.
Figure 5:
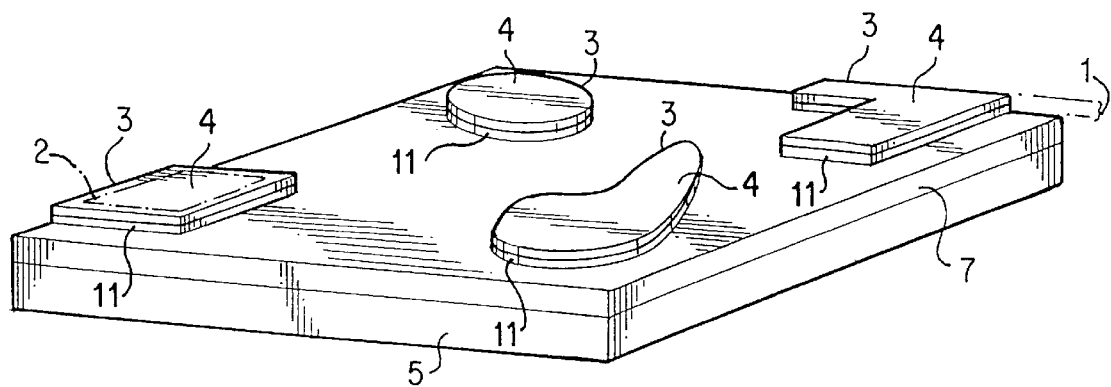
FIG. 5 shows a composite substrate with a semiconductor layer deposited exclusively on top of diamond islands.

The semiconductor layer 4 is deposited on the diamond layer 1 preferably in an epitaxial manner, advantageously by means of liquid phase epitaxy (LPE) and/or by means of chemical vapor deposition (CVD), see FIGS. 4 and 5.

So that the electronic components or groups of components subsequently produced from the composite structure will exhibit a high quality, the diamond islands 11 of the diamond layer 1 are arranged underneath areas of the substrate which are subsequently used to produce the components (referred to hereinafter as "component source zones"), whereby the diamond islands 11 with respect to their surface are individual, separate from each and completely enclosed by an edge 3 which forms their margin. In this manner, discontinuities of the semiconductor layer, which form in particular during epitaxial deposition of the semiconductor layer 5, collect at the edges 3 which form the margins of the diamond islands 11 (see FIGS. 4 and 5).

In order to assure a sufficient collective effect of the edges 3, which favorably influences the quality of the semiconductor layer 5 on top of the diamond islands 11, the edges 3 desirably have a height which amounts to at least 10% of the layer thickness of the diamond layer 1 and changes in a sharp jump. In the embodiment illustrated in FIG. 1, the edge height corresponds to the layer thickness of the diamond layer 1 and forms an edge surface of the diamond island 11 which extends substantially perpendicular to the flat surface of the growth substrate 5, whereby the layer thickness of the diamond layer 1 decreases at the edges 3 as viewed in a direction away from the component source zone 2.

Expediently, the diamond layer 1 may also comprise individual diamond islands 11' in the regions between the component source zones 2 with edges formed as collecting edges 3'. As a result, discontinuities also collect at these collecting edges 3', and this has the effect of further reducing the density of discontinuities of the semiconductor layer 5 in the component source zones 2.

Since a growth substrate 5 of silicon can be produced on an industrial scale simply, inexpensively and in high purity, it is advantageous to utilize a monocrystalline growth substrate 5 of silicon. In this regard, however, the large lattice mismatch between diamond and silicon of more than 50% is problematic, since this can also result in the formation of discontinuities which later decrease the quality of the semiconductor layer 4 in the vicinity of the component source zones 2.

As a remedial measure, the growth substrate according to FIG. 1 is may be provided with an intermediate layer by means of which the influence of the lattice mismatch on the density of discontinuities of the semiconductor layer 5 over the diamond islands 11 is decreased.

The intermediate layer 7 preferably has a lattice structure similar to the diamond lattice (zinc blende structure, etc.), in which the elements of the material of the intermediate layer 7 are at least statistically distributed.

The lattice mismatch between the diamond layer 1 and the growth substrate 5 is then decreased in that the lattice constants of the intermediate layer have a value whose difference from the lattice constants of the diamond layer 1 is smaller than the difference between the lattice constants of the growth substrate 2 and the lattice constants of the diamond layer 1. Good results are thereby achieved with lattice mismatches smaller than 20%, particularly at normal layer thicknesses of diamond layers greater than 1 $\mu$m, whereby the quality of the layers increases as the degree of lattice mismatch decreases.

The intermediate layer 7 may comprise one or more crystalline layers, but it may also comprise an alloy with a regular alloy lattice, such as, for example, a silicon-carbon alloy or a cubic boronitride alloy.

In a case where the intermediate layer 7 is formed from a plurality of individual layers (not shown), the lattice constants of the individual layers slowly approach the value of the lattice constants of the diamond layer, whereby it should be kept in mind, that the lattice mismatch of successive individual layers is small, in particular less than 10%.

In the case of an alloy, the lattice constants of its alloy lattice may vary continuously across its composition with increasing distance from the growth substrate toward the value of the lattice constants of the diamond layer 1.

Figure 2:
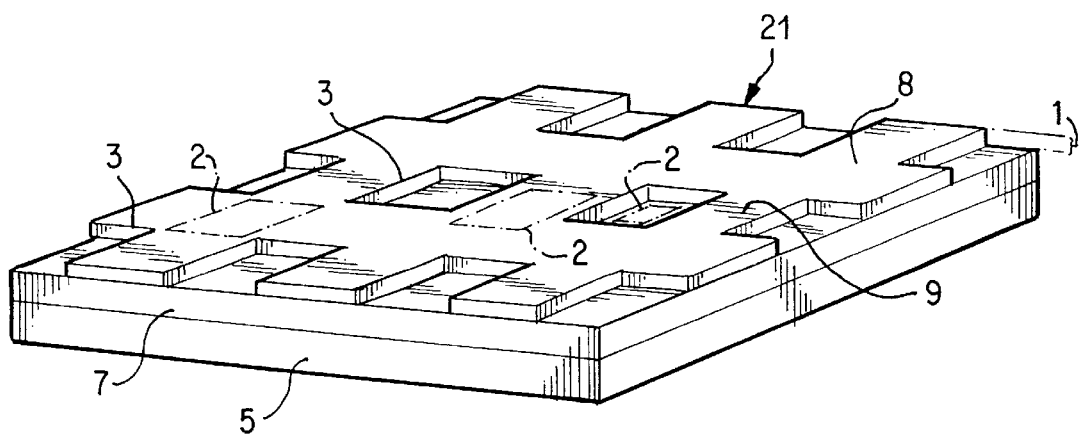
FIG. 2 shows a growth substrate with a diamond layer having a net-like form deposited thereon.

In FIG. 2, a growth substrate 5 is illustrated on which a diamond layer 21 is arranged in network-like form at least at the surface, which comprises points of intersection 8 and strips 9 which connect the points of intersection. The points of intersection 8 which form raised portions on the growth substrate 5, and/or the strips 9 which connect the points of intersection are arranged underneath the component source zones 2. As a result of this construction of the diamond layer, at least near the surface, a higher density of discontinuities (i.e., an increased collection of discontinuities, such as displacements, etc.) is to be found at the edges 3, which form the margins of the points of intersection 8 and which are disposed at, or outside of, the component source zones 2, in comparison to the density of discontinuities at the surface of the semiconductor layer 5 in the area of the component source zones 2 after the deposition of the semiconductor layer 5 (see FIGS. 4 and 5) on the diamond layer 1 has been completed.

In order to prevent lattice mismatches between the growth substrate 5 and the diamond layer 1 from adversely influencing the quality of the composite structure, it is also advantageous in this case to provide an intermediate layer 7 between the substrate 5 and the deposited diamond layer 1 as described above.

Figure 3:
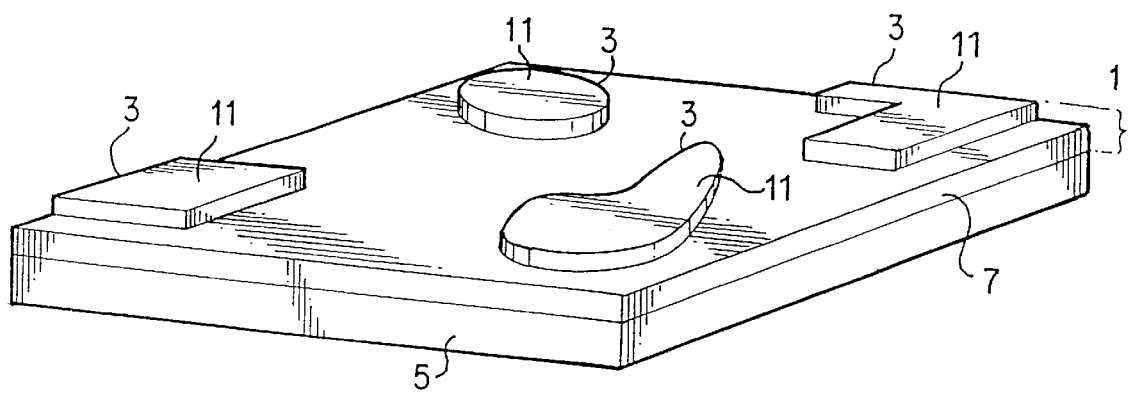
FIG. 3 shows a growth substrate with individual diamond islands which project upwardly from a continuous diamond layer deposited thereon.

In FIG. 3, a growth substrate 5 is illustrated on which a diamond layer 1 is arranged. The free surface of diamond layer 1, which subsequently is covered with the semiconductor layer 5, is provided with diamond islands 11, whose height above the surface on which they are arranged is smaller than the layer thickness of the overall diamond layer 1. In this case, the component source zones 2 can be arranged in the areas of the recesses or depressions between the diamond islands 11 and also in the areas of the diamond islands 11 themselves. In both cases the discontinuities collect at the edges which form the margins of the diamond islands 11.

In FIG. 4, a composite structure comprising a growth substrate 5 in accordance with FIG. 1 is illustrated. A plurality of diamond islands 11 are distributed over the surface of the substrate 5 in the areas of the component source zones 2. A semiconductor layer 4 is deposited on top of the diamond islands 11. In this embodiment, the semiconductor layer 4 projects beyond the margins of the diamond islands 11 and thereby has direct contact at its periphery with the surface of the silicon growth substrate (i.e. with the intermediate layer 7 which in this case is considered to be part of the silicon growth substrate). As a result of this peripheral contact of the semiconductor layer 4 with the growth substrate 5, during epitaxial deposition and/or subsequent recrystallization of the semiconductor layer 4, which preferably also is formed of silicon, the crystal information is transmitted from the growth substrate 5 into the semiconductor layer 4.

In FIG. 5, a composite structure is illustrated which is similar to that shown in FIG. 4. However, in the embodiment of FIG. 5, the semiconductor layer 4 is deposited exclusively on top of the diamond islands 11 of the diamond layer 1 and has no direct contact with the growth substrate 5. Consequently, the crystal information for the heteroepitaxial deposition of the semiconductor layer 4 is transferred to the semiconductor layer from the diamond islands 11.

Figure 6:
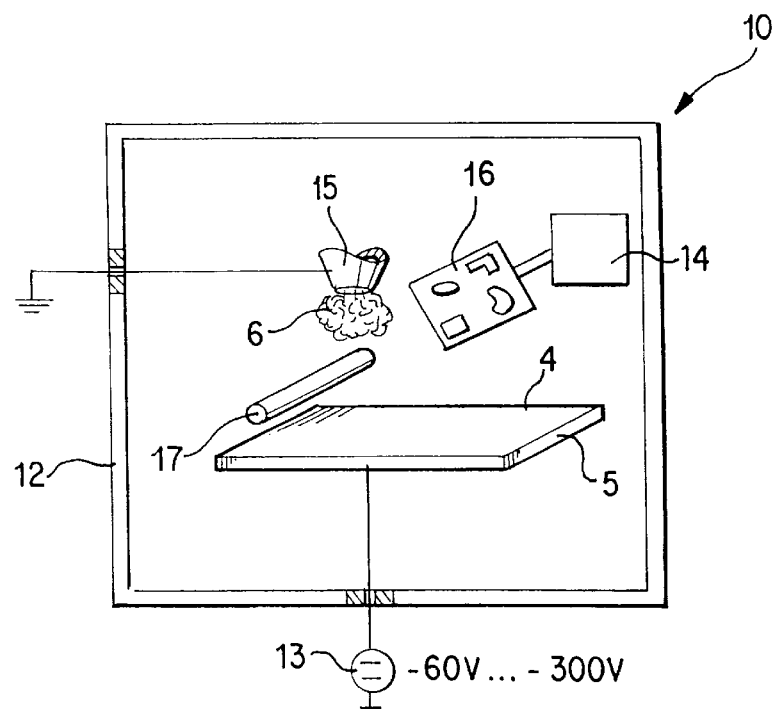
FIG. 6 shows one type of apparatus which can be used for production of the composite structure of the invention.

In FIG. 6, an apparatus 10 suitable for producing a composite structure in accordance with the invention is schematically illustrated. Apparatus 10 is constructed in the form of a chemical vapor deposition (CVD) installation comprising a reactor 12, a substrate holder with a voltage source 13 arranged thereon, a masking device 14 for selective deposition of the diamond layer 1, and a nozzle 15 for directing a process gas in the direction of the growth substrate 5. The reactor 12 is preferably evacuatable and can be filled with an inert gas at least to a pressure under 1,013 mbar. The apparatus 10 optionally may also comprise an additional energy device such as, for example, a microwave generator for activating a process gas used to produce a deposited layer. A heat source, such as heating wire 17, may also be provided to facilitate recrystallization of a deposited semiconductor layer 4.

The use of this apparatus 10 for producing a composite structure in accordance with the invention will be described hereinafter with reference to a composite structure according to FIG. 5. In order to produce the composite structure, the growth substrate 5 is cleaned and is arranged in an evacuatable reactor 12 of a CVD installation having the basic components depicted in FIG. 6.

In the reactor 12, the growth substrate 5 is contacted with a depositing gas phase 6, which is formed from a process gas, which comprises a known precursor material for the deposition of diamond layers 1. Suitable precursor gases are known in the art and may include, inter alia, methane, carbon monoxide, ethanol, acetylene, acetone and/or similar carbon-containing compounds. The diamond layer may be grown substantially heteroepitaxially, which means that the crystal growth information is transferred epitaxially to the depositing diamond layer from an underlying crystalline growth substrate formed of a different material (e.g. monocrystalline silicon), so that the growth of the deposited diamond crystal is guided by the lattice of the underlying growth substrate, and the axes of the crystal lattice of the substantially heteroepitaxially grown diamond layer are oriented with respect to the corresponding axes of the crystal lattice of the underlying substrate.

Before the epitaxial deposition of the diamond layer, the growth substrate 5 optionally may be provided with an intermediate layer 7 of an alloy such as silicon carbide (Si-C) or cubic boronitride (c-BN) which has a regular alloy lattice with alloy elements statistically arranged therein in order to achieve better lattice matching of the growth substrate 5 and the diamond layer 1. If desired, the intermediate layer 7 may be applied with a composition which varies with increasing layer thickness so that at the beginning the lattice constants of the intermediate layer correspond approximately to those of the growth substrate 5 and at the end, that is to say, approaching the diamond layer, correspond to those of the diamond layer. In other words, for example, one may start the intermediate layer of substantially pure silicon and gradually change the composition of the applied material until one ends with substantially pure carbon.

After completed deposition of the intermediate layer 7, the growth substrate 5 is covered with a mask 16 by means of a masking device 14, such as is conventionally used in the semiconductor industry. Mask 16 blocks deposition of the diamond layer 1 except in areas where it is desired to produce a component source zone 2. As a result, during subsequent epitaxial deposition of a diamond layer 1, the diamond layer will grow only underneath the subsequently required component source zones 2, and the diamond layer will be formed with edges 3 at the margins of, or outside of, the component source zones 2. During deposition of the diamond layer 1, it is advantageous if, at least at the beginning of the deposition, the growth substrate 5 is raised to a potential which differs with respect to that of the respective depositing gas phase 6. The measured substrate voltage relative to the depositing gas phase 6 desirably will amount to between −50 V and −800 V, preferably between about −60 V and about −300 V, for example about −150 V.

The deposited diamond layer is at least polycrystalline in nature. Preferably the deposited diamond layer 1 will be substantially monocrystalline and have its crystal axes oriented to within 10° of the corresponding axes of the underlying growth substrate, e.g. of substantially monocrystalline silicon. Since in the present working embodiment the diamond layer 1 consists entirely of interrupted, separate diamond islands, which project upwardly like towers from the surface of the growth substrate 5, the edges 3 have an edge height which corresponds to the layer thickness of the diamond layer 1. During subsequent growth and recrystallization of the semiconductor layer 4, the discontinuities collect at these edges 3, and consequently the semiconductor layer 4 above the diamond islands 11 exhibits a Lower density of discontinuities.

Besides the selective deposition with the aid of a mask 16 of the diamond layer 1 comprising diamond islands 11, the growth substrate 5 can also be pretreated in such a way that the diamond layer 1 will deposit selectively only on treated or untreated areas of the surface of on the growth substrate 5 or on treated or untreated areas of a previously deposited, continuous diamond layer 1 which at least substantially covers the growth substrate 5. Thus, for example, a diamond layer 1 can first be deposited over substantially the entire surface of the growth substrate up to a layer thickness which corresponds to the height of the bottoms of the recesses above the silicon of the growth substrate 5. Thereafter, the areas where it is desired to subsequently form diamond islands are blocked off with the aid of a mask, and a protective substance, for example silicon dioxide ($SiO_2$), is selectively deposited in the unblocked areas outside the areas where it is desired to form the diamond islands. The deposition of $SiO_2$ is followed by removal of the mask and further deposition of diamond in the areas where it is desired to form diamond islands 11 up to the height of the $SiO_2$. Finally, the $SiO_2$ is removed, for example, by etching it away with conventional etching solutions for silicon dioxide.

Besides a selective deposition of the diamond layer 1 comprising diamond islands 11, it is also possible to first provide the growth substrate 5 with a continuous diamond layer 1 which at least substantially covers the growth substrate 5 and which then is selectively removed.

Depending on the intended application, the diamond layer can thereby be removed either completely or also only partially outside of the diamond islands 11.

The selective removal of this continuous diamond layer which has an approximately uniform layer thickness can be effected in particular by selective etching and/or by means of laser ablation.

Another alternative way of producing diamond layers with edges according to the invention is to use lithographic techniques (e.g. photolithography or X-ray lithography) which are conventionally utilized in the semiconductor field for producing integrated circuits. Such processes are capable of producing layers having virtually any desired configuration on the surface of a substrate. For example, in this case a photoresist may be applied on top of a diamond layer deposited over the entire surface of a growth substrate. The photoresist is then exposed to a light pattern corresponding to the desired contours of the diamond islands. The unexposed portions of the photoresist are then washed away, for example with an acid solution, and then the exposed portions of the diamond layer can be selectively etched away, followed by removal of the photoresist to uncover the remaining diamond islands. Of course, a negative photoresist could also be used in place of the positive photoresist described above.

Moreover, since the etching rate is a function of time, it is not necessary to completely removed the exposed areas of the diamond layer. Instead, it is sufficient if a sufficient thickness of the exposed areas of the diamond layer is etched away so that a sharp edge is formed at the boundary between the exposed areas of the diamond layer and the thicker portions still covered by the photoresist.

The semiconductor layer can be deposited on the growth substrate 5 provided with the diamond layer 1 by means of a known CVD process from a gas which comprises a likewise known precursor material for a semiconductor. Numerous suitable processes and precursors are known to persons skilled in the semiconductor art.

In some cases, it is also desirable to deposit the semiconductor layer 4 by means of liquid phase epitaxy (LPE) on the diamond layer 1 of the growth substrate 5. This procedure has the advantage that it is the oldest process with one of the simplest apparatus for an epitaxy, whereby, among other things, a great many parameters are already known for depositing the most varied semiconductor layers.

In principle, the semiconductor layer 4 can be deposited heteroepitaxially exclusively on top of or above the surface of the diamond islands 11 as illustrated in FIG. 5.

Composite structures with diamond islands 11, which are arranged exactly underneath the component source zones 2, and in which additionally their edge heights also correspond approximately to the layer thickness of the diamond layer 1 have the particular advantage that after deposition of the semiconductor layer and production of the electronic component, the danger that the diamond layer will spall off from the growth substrate, which previously has been a serious problem when the components were cut out of the composite structures, is substantially reduced, if not eliminated.

It is also possible, however, to deposit the semiconductor layer 4 over the entire surface of the growth substrate 5, i.e with the semiconductor layer 4 projecting over the edges of the diamond islands. This procedure facilitates simpler deposition of the semiconductor layer 4.

Composite structures of this type in which the diamond islands 11 additionally are also larger in area than the component source zones are particularly advantageous, since in this case the discontinuities collect at the edges 3 which form the margins of the diamond islands 11 and which lie outside of the component source zones 2. Because the discontinuities collect outside the component source zones, the components also exhibit a low density of discontinuities even at the margins of the component source zones 2.

In order to improve the quality of the semiconductor layer 4, energy may be supplied to the deposited semiconductor layer 4 to increase the energy level of its crystal lattice. The increase in lattice energy may increase the temperature of the semiconductor layer up to a temperature approaching the melting temperature of the semiconductor layer. Due to this increase in the lattice energy of the crystal lattice, the component parts of the crystal lattice can arrange or rearrange themselves in more ideal fashion, and as a result of this rearrangement, the semiconductor layer 4 is recrystallized to more nearly approach an ideal crystal lattice.

Depending on whether the semiconductor layer 4 is constructed with the semiconductor layer either disposed heteroepitaxially solely on top of the diamond islands 11, or overlapping over the diamond islands 11 onto the underlying growth substrate 5, during recrystallization of the semiconductor layer the crystal information for the semiconductor layer also will be transferred from the diamond islands 11, or from the growth substrate 5, respectively, to the semiconductor layer 4 just as it is during deposition of the semiconductor layer.

In order to effect recrystallization, the deposited semiconductor layer 4 is heated to a temperature in the vicinity of the melting temperature, in particular a few degrees celsius below the melting temperature of the semiconductor layer 4. This heating can, for example, be carried out by means of an oven, by means of a heating wire 17 which is moved toward the surface of the composite structure, by means of a plasma which is arranged above and/or in the vicinity of the semiconductor layer 4, by means of a laser, by application of ultraviolet radiation, by coupling microwave or radio frequency energy in the area of the diamond layer.

A zone melting process in which, in particular, a heating wire 17 is moved over the surface of the semiconductor layer, has proved to be of particular advantage for recrystallization. During the movement of the heating wire 17 over the surface of the semiconductor layer 4, the discontinuities of the diamond islands 11 or of the component source zones 2 are driven in the direction of the edges 3 where they collect, so that the surface in the interior of the diamond islands or in the vicinity of the component source zones is substantially free of discontinuities.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A composite structure comprising a semiconductor layer arranged on a layer of diamond or diamond-like material, the layer of diamond or diamond-like material being disposed on an intermediate layer, the intermediate layer being disposed on a growth substrate, said composite structure defining at least one component source zone for subsequent processing into at least one electronic component, wherein said layer of diamond or diamond-like material is formed with at least one edge at which said layer of diamond or diamond-like material changes abruptly in thickness by at least 10%, wherein said at least one edge surrounds at least part of said at least one component source zone, and wherein said intermediate layer has lattice constants that vary, and said intermediate layer is either formed by a plurality of crystalline layers or formed of an alloy whose composition varies, or both.

2. A composite structure according to claim 1, wherein said layer of diamond or diamond-like material changes abruptly in thickness by at least 50% at said at least one edge.

3. A composite structure according to claim 1, wherein said layer of diamond or diamond-like material changes in thickness by decreasing in thickness outside said at least one component source zone.

4. A composite structure according to claim 1, wherein said layer of diamond or diamond-like material comprises a plurality of individual diamond islands which are separate from each other, each diamond island being completely surrounded by one of said edges which defines margins of the diamond island, and wherein a diamond island is arranged underneath each component source zone.

5. A composite structure according to claim 1, wherein the layer of diamond or diamond-like material is constructed like a network, and wherein the layer of diamond or diamond-like material is formed with elevations or depressions between one or more edges which enclose at least a portion of a component source zone.

6. A composite structure according to claim 1, wherein the edges have an edge height corresponding approximately to the thickness of the layer of diamond or diamond-like material.

7. A composite structure according to claim 1, wherein said layer of diamond or diamond-like material is a polycrystalline layer.

8. A composite structure according to claim 1, wherein said layer of diamond or diamond-like material is a monocrystalline layer.

9. A composite structure according to claim 1, wherein the semiconductor layer extends at least partially across edges which define margins of said at least one component source zone.

10. A composite structure according to claim 1, wherein said layer of diamond or diamond-like material further comprises discontinuity collecting edges arranged between component source zones.

11. A composite structure according to claim 1, wherein said layer of diamond or diamond-like material is arranged on a growth substrate formed of silicon.

12. A composite structure according to claim 11, wherein said growth substrate is formed of monocrystalline silicon.

13. A composite structure according to claim 1, wherein the semiconductor layer is arranged exclusively on top of the layer of diamond or diamond-like material and only in the component source zones.

14. A process for producing a composite structure comprising a semiconductor layer arranged on a layer of diamond or diamond-like material, said process comprising the steps of:
 (a) depositing an intermediate layer on a crystalline growth substrate
 (b) depositing a layer of diamond or diamond-like material on the intermediate layer to form an intermediate substrate, said layer of diamond or diamond-like material defining at least one component source zone on said intermediate substrate for subsequent processing into at least one electronic component;
 (c) contacting the intermediate substrate in an evacuatable reactor with a gas comprising a semiconductor precursor and depositing a semiconductor layer from the precursor gas onto the layer of diamond or diamond-like material at least in said at least one component source zone on said intermediate substrate;
 said layer of diamond or diamond-like material being provided outside of said at least one component source zone with at least one edge at which it changes abruptly in thickness by at least 10%, wherein said intermediate layer has lattice constants that vary, and said intermediate layer is either formed by a plurality of crystalline layers or formed of an alloy whose composition varies, or both.

15. A process according to claim 14, wherein said layer of diamond or diamond-like material changes abruptly in thickness by at least 50% at said at least one edge.

16. A process according to claim 14, wherein the edges at least partially enclose the component source zones, and the layer of diamond or diamond-like material is provided with raised portions between said edges.

17. A process according to claim 14, wherein the edges at least partially enclose the component source zones, and the layer of diamond or diamond-like material is provided with depressed portions between said edges.

18. A process according to claim 14, wherein the layer of diamond or diamond-like material has a net-like structure with elevated portions arranged in the component source zones.

19. A process according to claim 14, wherein the layer of diamond or diamond-like material has a net-like structure with depressed portions arranged in the component source zones.

20. A process according to claim 14, wherein the diamond or diamond-like material is deposited on the growth substrate as a plurality of individual diamond islands which are separate from each other, and each component source zone has a diamond island disposed thereunder.

21. A process according to claim 14, wherein the layer of diamond or diamond-like material is deposited at least in the component source zones on the growth substrate by chemical vapor deposition.

22. A process according to claim 14, wherein the semiconductor layer is deposited on the intermediate substrate by chemical vapor deposition.

23. A process according to claim 14, wherein the semiconductor layer is deposited on the layer of diamond or diamond-like material by means of liquid phase epitaxy.

24. A process according to claim 14, wherein the growth substrate is first provided with a layer of diamond or diamond-like material which substantially covers the growth substrate, and subsequently said at least one edge is introduced into the layer of diamond or diamond-like material.

25. A process according to claim 14, wherein the growth substrate is first provided with a layer of diamond or diamond-like material which substantially covers the growth substrate, and subsequently part of the layer of diamond or diamond-like material is removed to form said at least one edge.

26. A process according to claim 25, wherein part of the layer of diamond or diamond-like material is removed by selective etching to form said at least one edge.

27. A process according to claim 25, wherein part of the layer of diamond or diamond-like material is removed by laser ablation to form said at least one edge.

28. A process according to claim 14, wherein the growth substrate is pretreated such that the layer of diamond or diamond-like material is deposited only on selected surface areas of the growth substrate.

29. A process according to claim 28, wherein said pretreatment is effected by coating areas of the growth substrate outside of the component source zones with a layer of material which resists deposition of diamond thereon; the layer of diamond or diamond-like material thereafter being deposited in component source zone areas uncoated by the resist material layer, and then removing the resist material layer; the resist material layer having a thickness substantially corresponding to the edge height of the deposited layer of diamond or diamond-like material.

30. A process according to claim 14, wherein the growth substrate is substantially covered by the layer of diamond or diamond-like material, said layer of diamond or diamond-like material comprising elevated portions in the component source zones which exhibit an increased thickness compared to said layer outside the component source zones.

31. A process according to claim 14, wherein the deposited layer of diamond or diamond-like material is a polycrystalline layer.

32. A process according to claim 14, wherein the deposited layer of diamond or diamond-like material is a substantially monocrystalline layer.

33. A process according to claim 14, further comprising supplying energy to the deposited semiconductor layer and recrystallizing the semiconductor layer to improve its crystal lattice.

34. A process according to claim 14, wherein said at least one edge defines the periphery of the at least one component source zone, and the deposited semiconductor layer extends outside of said at least one component source zone across said at least one edge.

35. A process according to claim 14, further comprising heating the deposited semiconductor layer to a temperature below its melting temperature, and recrystallizing the semiconductor layer with crystal information passed to the semiconductor layer from the growth substrate.

36. A process according to claim 35, wherein the semiconductor layer is heated by means of a laser beam.

37. A process according to claim 35, wherein the semiconductor layer is recrystallized by a zone melting process.

38. A process according to claim 14, further comprising heating the deposited semiconductor layer to a temperature below its melting temperature, and recrystallizing the semiconductor layer with crystal information passed to the semiconductor layer from the layer of diamond or diamond-like material.

39. A process according to claim 38, wherein the semiconductor layer is heated by means of a laser beam.

40. A process according to claim 38, wherein the semiconductor layer is recrystallized by a zone melting process.

41. A process according to claim 14, wherein the layer of diamond or diamond-like material is deposited from a gas phase, and at least at the beginning of the deposition of the layer of diamond or diamond-like material, an electrical potential which differs from that of said gas phase is applied to the growth substrate.

42. A process according to claim 41, wherein the applied electrical potential is a negative electrical potential.

43. A process according to claim 42, wherein a voltage of from −60 V to −300 V is applied to the growth substrate.

44. A process according to claim 14, wherein at least at the beginning of the deposition of the semiconductor layer, an electrical potential which differs from that of the precursor gas is applied to the growth substrate.

45. A process according to claim 44, wherein the applied electrical potential is a negative electrical potential.

46. A process according to claim 45, wherein a voltage of from −60 V to −300 V is applied to the growth substrate.

* * * * *